(12) United States Patent
Chung

(10) Patent No.: US 10,840,928 B2
(45) Date of Patent: Nov. 17, 2020

(54) STOCHASTIC TIME-TO-DIGITAL CONVERTER AND OPERATING METHOD THEREOF

(71) Applicant: KOREA UNIVERSITY RESEARCH AND BUSINESS FOUNDATION, SEJONG CAMPUS, Sejong-si (KR)

(72) Inventor: Hayun Cecillia Chung, Daejeon (KR)

(73) Assignee: Korea University Research and Business Foundation, Sejong-si (KR)

( * ) Notice: Subject to any disclaimer, the term of this patent is extended or adjusted under 35 U.S.C. 154(b) by 0 days.

(21) Appl. No.: 16/689,246

(22) Filed: Nov. 20, 2019

(65) Prior Publication Data
US 2020/0162085 A1 May 21, 2020

(30) Foreign Application Priority Data

Nov. 21, 2018 (KR) .................. 10-2018-0144720
May 24, 2019 (KR) .................. 10-2019-0060931

(51) Int. Cl.
*H03M 1/04* (2006.01)
*G04F 10/00* (2006.01)

(52) U.S. Cl.
CPC ............ *H03M 1/04* (2013.01); *G04F 10/005* (2013.01)

(58) Field of Classification Search
CPC .............................. H03M 1/04; G06F 10/005
See application file for complete search history.

(56) References Cited

U.S. PATENT DOCUMENTS 7,557,746 B1 * 7/2009 Waltari ................ H03M 1/206
341/158
7,737,875 B2 * 6/2010 Waltari ................ H03M 1/206
341/158
(Continued)

FOREIGN PATENT DOCUMENTS

JP 2010-109154 A 5/2010
JP 2012-175598 A 9/2012
(Continued)

OTHER PUBLICATIONS

Robert Bogdan Staszewski, et al., "1.3 V 20 ps Time-to-Digital Converter for Frequency Synthesis in 90-nm CMOS", IEEE Transactions on Circuits and Systems—II: Express Briefs, vol. 53, Mar. 2006.
(Continued)

*Primary Examiner* — Howard Williams
(74) *Attorney, Agent, or Firm* — Harness, Dickey & Pierce, P.L.C.

(57) ABSTRACT

Disclosed is a stochastic time-to-digital converter, which includes a first arbiter cell that compares a timing of a reference signal and a timing of an input signal based on a voltage selected by a first selection signal from among a first voltage or a second voltage and outputs a first comparison result, a second arbiter cell that compares the timing of the reference signal with the timing of the input signal based on a voltage selected by a second selection signal from among the first voltage or the second voltage and outputs a second comparison result, and a binary converter that calculates a phase difference between the reference signal and the input signal based on the first comparison result and the second comparison result.

14 Claims, 8 Drawing Sheets

(56) References Cited

U.S. PATENT DOCUMENTS

| | | |
|---|---|---|
| 8,390,349 B1 | 3/2013 | Ravi et al. |
| 8,514,121 B1 * | 8/2013 | Shu .................... H03M 1/50 |
| | | 341/155 |
| 8,810,440 B2 | 8/2014 | Wu et al. |
| 9,013,216 B2 | 4/2015 | Boo et al. |
| 10,673,452 B1 * | 6/2020 | Soundararajan ...... H03M 1/207 |

FOREIGN PATENT DOCUMENTS

| | | |
|---|---|---|
| KR | 10-2014-0112656 A | 9/2014 |
| KR | 2014-0137276 A | 12/2014 |

OTHER PUBLICATIONS

Piotr Dudek, et al., "High-Resolution CMOS Time-to-Digital Converter Utilizing a Vernier Delay Line", IEEE Transactions on Solid-State Circuits, vol. 35, Feb. 2000.

Minjae Lee, et al., "A9 b, 1.25 ps Resolution Coarse-Fine Timeto-Digital Converter in 90 nm CMOS that Amplifies a Time Residue", IEEE Journal of Solid-State Circuits, vol. 43, Apr. 2008.

Volodymyr Kratyuk, et al., "A Digital PLL With a Stochastic Time-to-Digital Converter", IEEE Transactions on Circuits and Systems—I: Regular Papers, vol. 56, Aug. 2009.

Office Action for European Application No. 19209126.2 dated Apr. 14, 2020.

Amer Samarah et al., "A Digital Phase-Locked Loop With Calibrated Coarse and Stochastic Fine TDC," IEEE Jounral of Solid-State Circuits, IEEE, USA, vol. 48, No. 8, Aug. 1, 2013, pp. 1829-1841, XP011520809.

* cited by examiner

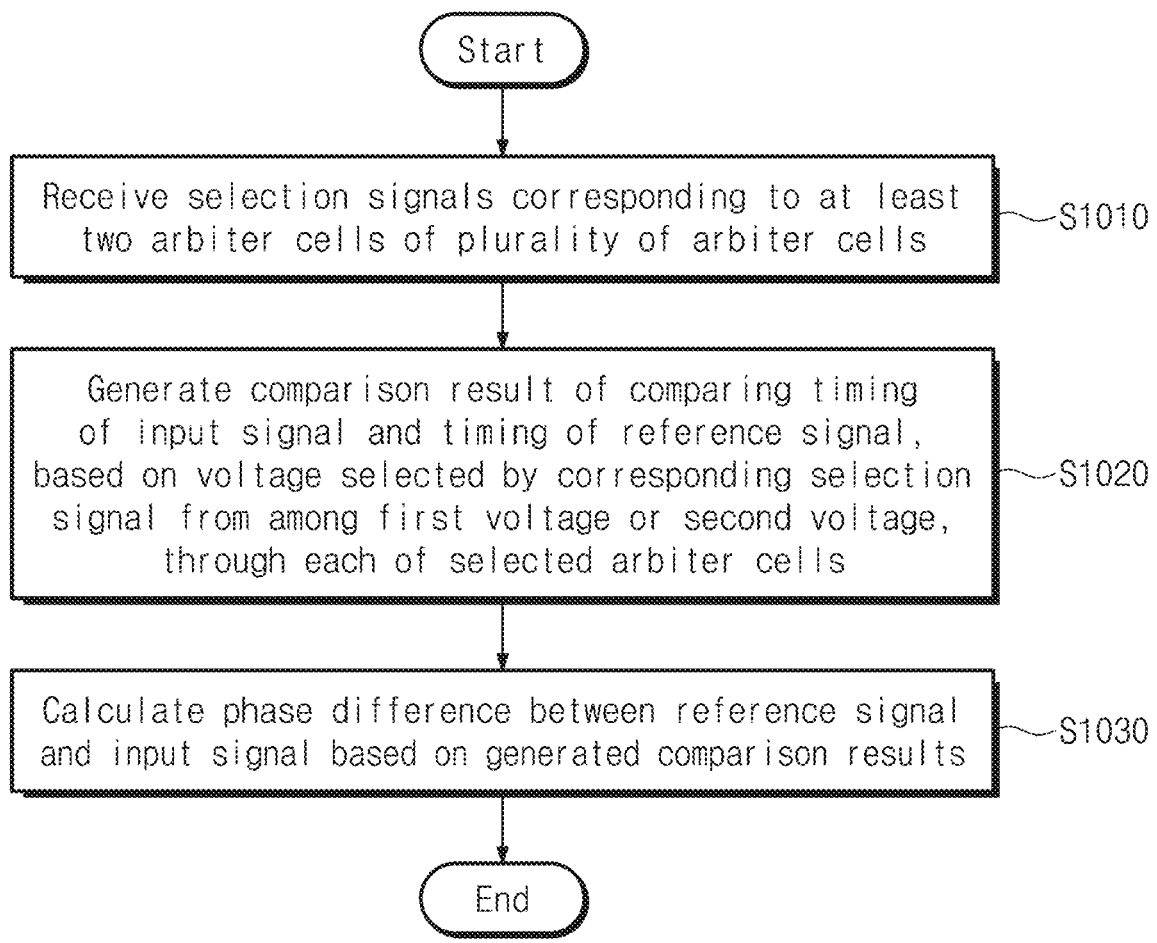

STOCHASTIC TIME-TO-DIGITAL CONVERTER AND OPERATING METHOD THEREOF

CROSS-REFERENCE TO RELATED APPLICATIONS

This application claims priority under 35 U.S.C. § 119 to Korean Patent Applications Nos. 10-2018-0144720 and 10-2019-0060931 respectively filed on Nov. 21, 2018 and May 24, 2019, in the Korean Intellectual Property Office, the disclosures of which are incorporated by reference herein in their entireties.

BACKGROUND

Embodiments of the inventive concept described herein relate to a time-to-digital converter (TDC), and more particularly, relate to a stochastic time-to-digital converter to convert a phase difference between signals into a digital code and an operating method thereof.

As the size of a component (or device or element) gradually decreases together with the development of a semiconductor process, a signal speed in a chip gradually increases. One of important circuits necessary to process a high-speed signal is a time-to-digital converter (TDC) that measures a phase difference between two high-speed signals. The TDC is utilized in a phase locked loop (PLL) to generate and synchronize a clock signal, circuits to measure a timing (e.g., a jitter or a skew) in a chip, a temperature sensor, etc. As the signal speed in the chip increases, the TDC with ultrafine resolution is required.

As the development of the semiconductor process progresses in such a way that the size of the component decreases, a mismatch between components may occur, which makes it difficult to design the TDC having both ultrafine resolution and linearity. A stochastic TDC may utilize this mismatch between components to implement ultrafine resolution. However, because the mismatch between components is random, the non-linearity of the stochastic TDC may become great.

SUMMARY

Embodiments of the inventive concept provide a stochastic time-to-digital converter (TDC) capable of improving linearity of the stochastic TDC having ultrafine resolution and an operating method thereof.

According to an embodiment of the inventive concept, a stochastic time-to-digital converter includes a first arbiter cell that compares a timing of a reference signal and a timing of an input signal based on a voltage selected by a first selection signal from among a first voltage or a second voltage and outputs a first comparison result, a second arbiter cell that compares the timing of the reference signal with the timing of the input signal based on a voltage selected by a second selection signal from among the first voltage or the second voltage and outputs a second comparison result, and a binary converter that calculates a phase difference between the reference signal and the input signal based on the first comparison result and the second comparison result.

In an embodiment, each of the first selection signal and the second selection signal may be a 1-bit signal.

In an embodiment, when the first arbiter cell operates based on the first voltage, the first arbiter cell may have a first time offset. When the first arbiter cell operates based on the second voltage, the first arbiter cell may have a second time offset different from the first time offset.

In an embodiment, when the second arbiter cell operates based on the first voltage, the second arbiter cell may have a third time offset different from the first time offset. When the second arbiter cell operates based on the second voltage, the second arbiter cell may have a fourth time offset different from the second time offset.

In an embodiment, the first selection signal and the second selection signal may be determined such that an integral non-linearity (INL) error of the stochastic time-to-digital converter is minimized.

In an embodiment, the first selection signal and the second selection signal may be determined based on a process corner characteristic of the stochastic time-to-digital converter.

In an embodiment, the stochastic time-to-digital converter may further include a scan-chain circuit that receives the first selection signal and the second selection signal in series through one pad in response to a first clock signal and respectively provides the first selection signal and the second selection signal to the first arbiter cell and the second arbiter cell in parallel in response to a second clock signal.

According to an embodiment of the inventive concept, an operating method of a stochastic time-to-digital converter which includes a plurality of arbiter cells includes receiving selection signals corresponding to at least two arbiter cells of the plurality of arbiter cells, generating a timing comparison result of comparing a timing of a reference signal with a timing of an input signal, based on a voltage selected by a corresponding selection signal of the selection signals from among a first voltage or a second voltage, through each of the at least two arbiter cells, and calculating a phase difference between the reference signal and the input signal based on timing comparison results of the reference signal and the input signal generated from the at least two arbiter cells.

In an embodiment, each of the selection signals may be a 1-bit signal.

In an embodiment, each of the at least two arbiter cells may have different time offsets with respect to the first voltage and the second voltage.

In an embodiment, the selection signals may be determined such that an integral non-linearity (INL) error of the stochastic time-to-digital converter is minimized.

In an embodiment, the selection signals may be determined based on a process corner characteristic of the stochastic time-to-digital converter.

In an embodiment, a time offset which each of the at least two arbiter cells has with respect to the selected voltage may be within an input range of the stochastic time-to-digital converter.

In an embodiment, when the number of the at least two arbiter cells is "m", the number of combinations of time offsets which the at least two arbiter cells have is $2^m$.

BRIEF DESCRIPTION OF THE FIGURES

The above and other objects and features of the inventive concept will become apparent by describing in detail exemplary embodiments thereof with reference to the accompanying drawings.

FIG. 4 is a flow chart illustrating an example of a stochastic TDC according to an embodiment of the inventive concept.

DETAILED DESCRIPTION

Hereinafter, embodiments of the inventive concept are described in detail with reference to the accompanying drawings. In the following description, specific details such as detailed components and structures are merely provided to assist the overall understanding of the embodiments of the inventive concept. Therefore, it should be apparent to those skilled in the art that various changes and modifications of the embodiments described herein may be made without departing from the scope and spirit of the present invention. In addition, descriptions of well-known functions and structures are omitted for clarity and conciseness. The terms described below are terms defined in consideration of the functions in the inventive concept and are not limited to a specific function. The definitions of the terms should be determined based on the contents throughout the specification.

In the following drawings or in the detailed description, modules may be illustrated in a drawing or may be connected with any other components other than components in the detailed description. Modules or components may be connected directly or indirectly. Modules or components may be connected through communication or may be physically connected.

Unless defined differently, all terms used herein, which include technical terminologies or scientific terminologies, have the same meaning as that understood by a person skilled in the art to which the present invention belongs. Terms defined in a generally used dictionary are to be interpreted to have meanings equal to the contextual meanings in a relevant technical field, and are not interpreted to have ideal or excessively formal meanings unless clearly defined in the specification.

Figure 1:
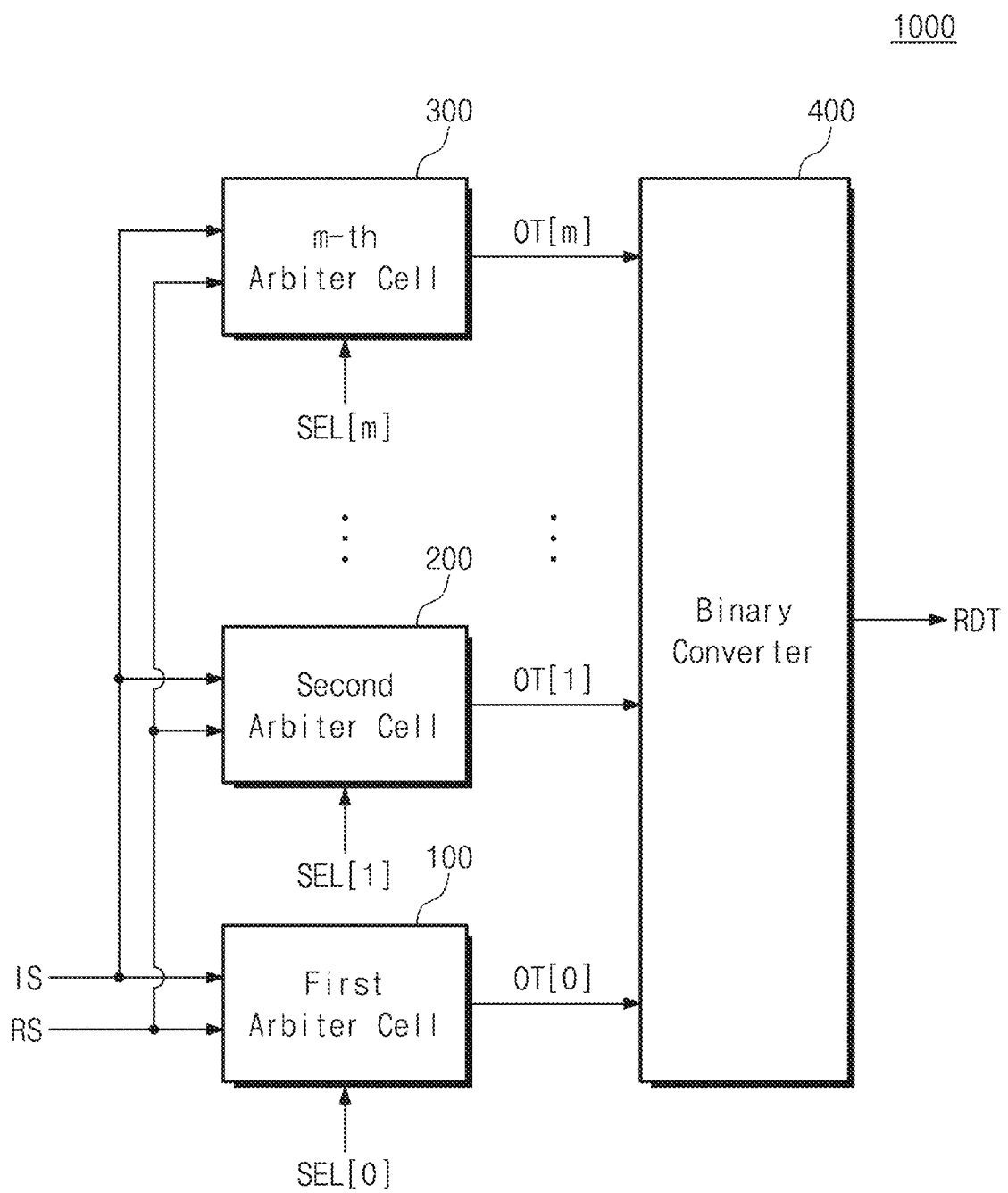
FIG. 1 is an exemplary block diagram of a stochastic TDC according to an embodiment of the inventive concept.

FIG. 1 is a block diagram of a stochastic TDC according to an embodiment of the inventive concept. Referring to FIG. 1, a stochastic TDC 1000 may include first to m-th arbiter cells 100 to 300 and a binary converter 400.

The stochastic TDC 1000 may calculate a phase difference (or a time difference) between an input signal IS and a reference signal RS by using a time offset of each of the arbiter cells 100 to 300 generated from a mismatch between components. The time offset means an offset between an actual phase difference between the input signal IS and the reference signal RS and a phase difference detected by each of the arbiter cells 100 to 300. Each of the arbiter cells 100 to 300 may have a random time offset depending on a process variation, and thus, the arbiter cells 100 to 300 may have different time offsets. The stochastic TDC 1000 may finely calculate a phase difference between the input signal IS and the reference signal RS based on random time offsets of the arbiter cells 100 to 300.

As such, because the stochastic TDC 1000 utilizes the time offsets of the arbiter cells 100 to 300 without modification, it is not required an effort to decrease a time offset (e.g., it is not required to increase the size of a component or it is not required a circuit for canceling out a time offset). That is, the arbiter cells 100 to 300 may be implemented by using components of the minimum size. Accordingly, the size of the arbiter cells 100 to 300 may be scaled down, and power consumption of the arbiter cells 100 to 300 may be reduced. Also, because the stochastic TDC 1000 uses a difference between time offsets, the stochastic TDC 1000 may measure a phase difference between the input signal IS and the reference signal RS very finely.

Each of the arbiter cells 100 to 300 may receive the input signal IS, the reference signal RS, and a selection signal SEL. Each of the arbiter cells 100 to 300 may operate based on a voltage selected by the selection signal SEL from among a plurality of voltages. For example, in the case where a selection signal SEL[0] is a 1-bit signal, the first arbiter cell 100 may operate based on a first voltage in response to the selection signal SEL[0] of "0" and may operate based on a second voltage in response to the selection signal SEL[0] of "1".

Based on the voltage selected by the corresponding selection signal SEL, each of the arbiter cells 100 to 300 may compare a timing of the input signal IS with a timing of the reference signal RS and may output a comparison result OT. For example, based on the voltage selected by the selection signal SEL[0], the first arbiter cell 100 may compare an edge timing of the input signal IS with an edge timing of the reference signal RS and may output a comparison result OT[0]. For example, in the case where the edge timing of the input signal IS is advanced with respect to the edge timing of the reference signal RS, the first arbiter cell 100 may output "1" as the comparison result OT[0]. In the case where the edge timing of the input signal IS is delayed with respect to the edge timing of the reference signal RS, the first arbiter cell 100 may output "0" as the comparison result OT[0].

Because a time offset of each of the arbiter cells 100 to 300 is determined randomly, comparison results OT[O] to OT[m] that are output from the arbiter cells 100 to 300 may be different even though the arbiter cells 100 to 300 receive the same input. For example, in the case where the selection signals SEL[0] and SEL[1] of the same value are respectively provided to the first and second arbiter cells 100 and 200, each of the first and second arbiter cells 100 and 200 may compare a timing of the input signal IS with a timing of the reference signal RS based on the same voltage. In this case, the comparison result OT[O] output from the first arbiter cell 100 may be different from the comparison result OT[1] output from the second arbiter cell 200. That is, with regard to the same voltage, a time offset of the first arbiter cell 100 and a time offset of the second arbiter cell 200 may be different, and thus, the comparison result OT[0] output from the first arbiter cell 100 and the comparison result OT[1] output from the second arbiter cell 200 may be different.

A time offset that each of the arbiter cells 100 to 300 has may vary depending on the selection signal SEL. For example, in the case where the first arbiter cell 100 operates based on the first voltage in response to the selection signal SEL, the first arbiter cell 100 may have a first time offset. In the case where the first arbiter cell 100 operates based on the second voltage in response to the selection signal SEL, the first arbiter cell 100 may have a second time offset. In this case, the first time offset may be different from the second time offset. For example, in the case where the selection signal SEL[0] is a 1-bit signal, the first arbiter cell 100 may have two different time offsets.

The binary converter 400 may calculate a phase difference between the input signal IS and the reference signal RS based on the comparison results OT[0] to OT[m] output from the arbiter cells 100 to 300. The binary converter 400 may output the calculated phase difference as result data RDT of the form of a binary code. For example, the binary converter 400 may calculate a phase difference based on the number of 1's or 0's of the (m+1) comparison results OT[0] to OT[m]. For example, in the case where the number of arbiter cells 100 to 300 is ($2^N-1$) (i.e., in the case where "m" is ($2^N-2$)), the binary converter 400 may output the N-bit result data RDT. That is, the resolution of the stochastic TDC 1000 may vary depending on the number of arbiter cells 100 to 300.

An example is illustrated in FIG. 1 as the result data RDT are generated based on the comparison results OT[0] to OT[m] output from all the arbiter cells 100 to 300, but the inventive concept is not limited thereto. For example, the binary converter 400 may generate the result data RDT based on comparison results output from some arbiter cells selected from the arbiter cells 100 to 300. In this case, selection signals may be provided only to the selected arbiter cells. The number of arbiter cells to be selected may be determined depending on the resolution of the stochastic TDC 1000, and some arbiter cells may be selected in consideration of a time offset characteristic of each of the arbiter cells 100 to 300. For example, arbiter cells having a time offset within a required input range of the stochastic TDC 1000 may be selected.

As described above, in the case where the arbiter cells 100 to 300 have different time offsets depending on the selection signal SEL, the number of combinations of time offsets of the stochastic TDC 1000 may be maximized depending on the number of arbiter cells 100 to 300. For example, in the case where the number of arbiter cells 100 to 300 is "m", the number of combinations of time offsets of the stochastic TDC 1000 may be $2^m$. The linearity of the stochastic TDC 1000 may vary depending on a combination of time offsets of the stochastic TDC 1000. Accordingly, in the case where the selection signals SEL[0] to SEL[m] to be provided to the arbiter cells 100 to 300 are controlled, the linearity of the stochastic TDC 1000 may be improved.

Figure 2:
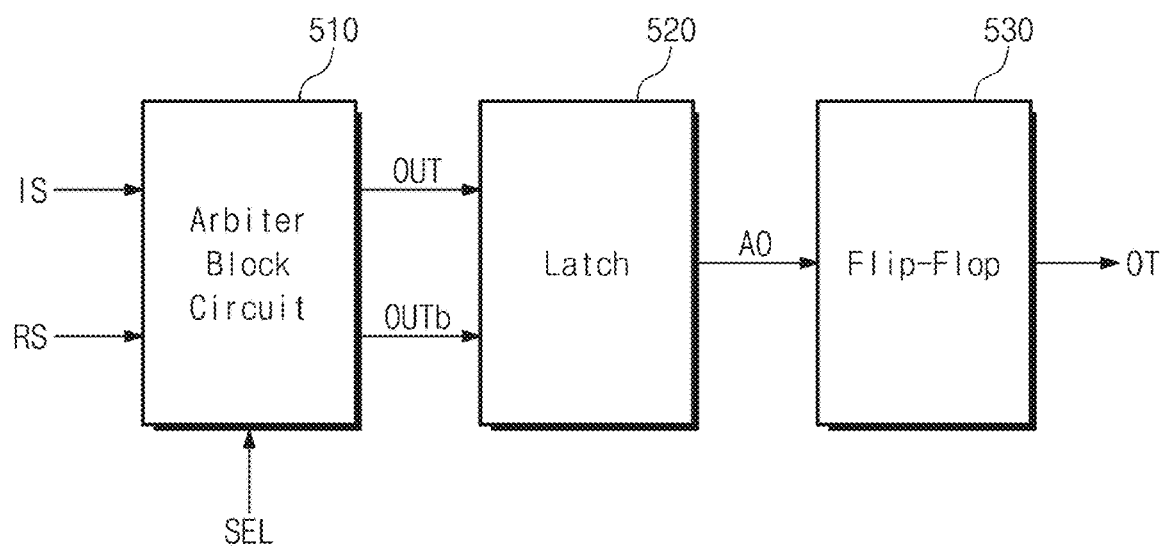
FIG. 2 is a block diagram illustrating an example of an arbiter cell of FIG. 1.

FIG. 2 is a block diagram illustrating an example of an arbiter cell of FIG. 1. Referring to FIG. 2, an arbiter cell 500 may include an arbiter block circuit 510, a latch 520, and a flip-flop 530.

The arbiter block circuit 510 may receive the input signal IS, the reference signal RS, and the selection signal SEL. The arbiter block circuit 510 may compare a timing of the input signal IS with a timing of the reference signal RS based on a voltage selected by the selection signal SEL As a comparison result, the arbiter block circuit 510 may generate a first output signal OUT and a second output signal OUTb. A phase difference between the first output signal OUT and the second output signal OUTb may be 180 degrees. For example, when a value of the first output signal OUT is "1", a value of the second output signal OUTb may be "0".

A voltage level of the output signals OUT and OUTb may vary depending on a magnitude (or a level) of a voltage selected depending on the selection signal SEL. For example, in the case where the magnitude of the selected voltage is small, a high level of the output signals OUT and OUTb may be smaller than a power supply voltage VDD of the stochastic TDC 1000. In this case, because the output signals OUT and OUTb do not full-swing, values (i.e., "0" and "1") of the output signals OUT and OUTb may fail to be distinguished.

The latch 520 may receive the output signals OUT and OUTb from the arbiter block circuit 510. The latch 520 may amplify the output signals OUT and OUTb by using a gain of an internal circuit so that values of the output signals OUT and OUTb are distinguished. As such, a differential value of the output signals OUT and OUTb may be amplified, and the output signals OUT and OUTb may be converted through full-swing. The latch 520 may output one AO of the amplified output signals OUT and OUTb. For example, the latch 520 may be a rail-to-rail latch, but the inventive concept is not limited thereto.

The flip-flop 530 may receive the amplified output signal AO output from the latch 520. The flip-flop 530 may sample the amplified output signal AO. In the case where it is still difficult to determine whether a voltage level of the output signal AO amplified by the latch 520 is "0" or "1", the flip-flop 530 may amplify the amplified output signal AO by using a gain of an internal circuit so that a value of the amplified output signal AO is identified. As such, the comparison result OT may be output from the flip-flop 530.

As described above, the arbiter cell 500 may operate based on various voltages. As such, it may be difficult to determine whether a value of a signal output from the arbiter cell 500 is "0" or "1". To prevent this metastability state, the arbiter cell 500 may include the latch 520 and the flip-flop 530. An example is illustrated in FIG. 2 as the arbiter cell 500 includes one latch 520 and one flip-flop 530, but the inventive concept is not limited thereto. For example, in the arbiter cell 500, the number of latches and the number of flip-flops may be variously determined.

Figure 3:
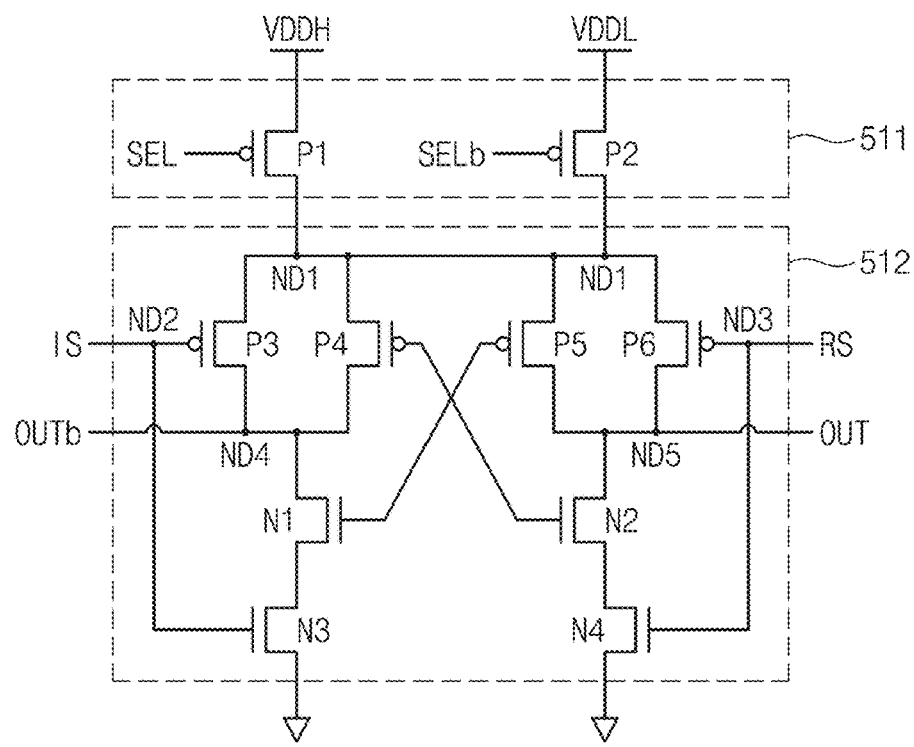
FIG. 3 is a circuit diagram illustrating an example of an arbiter block circuit of FIG. 2.

FIG. 3 is a circuit diagram illustrating an example of an arbiter block circuit of FIG. 2. Referring to FIG. 3, the arbiter block circuit 510 may include a power supply circuit 511 and a timing comparison circuit 512.

The power supply circuit 511 may include first and second PMOS transistors P1 and P2. A first end of the first PMOS transistor P1 is connected to a first voltage VDDH, and a second end thereof is connected to a first node ND1 of the timing comparison circuit 512. The selection signal SEL is provided to a gate terminal of the first PMOS transistor P1. A first end of the second PMOS transistor P2 is connected to a second voltage VDDL, and a second end thereof is connected to the first node ND1 of the timing comparison circuit 512. An inverted selection signal SELb is provided to a gate terminal of the second PMOS transistor P2. For example, in the case where the first PMOS transistor P1 is turned on by the selection signal SEL, the first voltage VDDH may be provided to the first node ND1 of the timing comparison circuit 512. In this case, the second PMOS transistor P2 may be turned off.

The timing comparison circuit 512 may include third to sixth PMOS transistors P3 to P6, and first to fourth NMOS transistors N1 to N4. The third to sixth PMOS transistors P3 to P6 and the first to fourth NMOS transistors N1 to N4 may constitute a cross-coupled latch.

The timing comparison circuit 512 may operate based on a voltage provided from the power supply circuit 511. For example, in the case where the first voltage VDDH is provided from the power supply circuit 511, the timing comparison circuit 512 may operate based on the first voltage VDDH.

The timing comparison circuit 512 may compare a timing of the input signal IS input to a second node ND2 with a timing of the reference signal RS input to a third node ND3 and may output the output signals OUT and OUTb. The first output signal OUT is output through a fifth node ND5, and the second output signal OUTb is output through a fourth node ND4. For example, in the case where the timing of the input signal IS is advanced with respect to the timing of the reference signal RS, a value of the first output signal OUT may be "1", and a value of the second output signal OUTb may be "0". In the case where the timing of the input signal IS is minutely different from the timing of the reference signal RS, it may be different to distinguish values of the first and second output signals OUT and OUTb output from the timing comparison circuit 512. In this case, as described with reference to FIG. 2, the first and second output signals OUT and OUTb may be amplified through the latch 520 and the flip-flop 530 that are placed in back of the arbiter block circuit 510. As such, the comparison result OT having a voltage level, of which a value is able to be identified, may be output.

As illustrated in FIG. 3, the arbiter cell 500 may operate based on one of the first voltage VDDH or the second voltage VDDL, which is selected by the 1-bit selection signal SEL. Below, as illustrated in FIG. 3, an operation of the stochastic TDC 1000 will be more fully described under the assumption that the arbiter cell 500 operates based on one of two voltages. However, the inventive concept is not limited thereto.

FIG. 4 is a flow chart illustrating an example of a stochastic TDC according to an embodiment of the inventive concept. Referring to FIGS. 1 and 4, in operation S1010, the stochastic TDC 1000 may receive selection signals corresponding to at least two arbiter cells of the plurality of arbiter cells 100 to 300. For example, the stochastic TDC 1000 may receive the selection signals SEL[0] to SEL[m] corresponding to all the arbiter cells 100 to 300, as illustrated in FIG. 1. Alternatively, the stochastic TDC 1000 may receive the selection signals SEL[0] and SEL[1] corresponding to some arbiter cells 100 and 200.

In operation S1020, the stochastic TDC 1000 may generate the comparison result OT of comparing the timing of the input signal IS with the timing of the reference signal RS, based on a voltage selected by the corresponding selection signal SEL from among the first voltage or the second voltage, through each of the selected arbiter cells. The selected arbiter cells may be arbiter cells corresponding to the received selection signals. As such, the stochastic TDC 1000 may generate at least two comparison results from the selected arbiter cells.

In operation S1030, the stochastic TDC 1000 may calculate a phase difference between the reference signal RS and the input signal IS based on the generated comparison results. The calculated phase difference may be output as the result data RDT of the form of a binary code.

As described above, in the case where there are provided only selection signals corresponding to some of the arbiter cells 100 to 300, the stochastic TDC 1000 may calculate a phase difference between the input signal IS and the reference signal RS by using only some arbiter cells. That is, the stochastic TDC 1000 may calculate a phase difference between the input signal IS and the reference signal RS based on some arbiter cells, as well as all the arbiter cells 100 to 300.

Figure 5A:
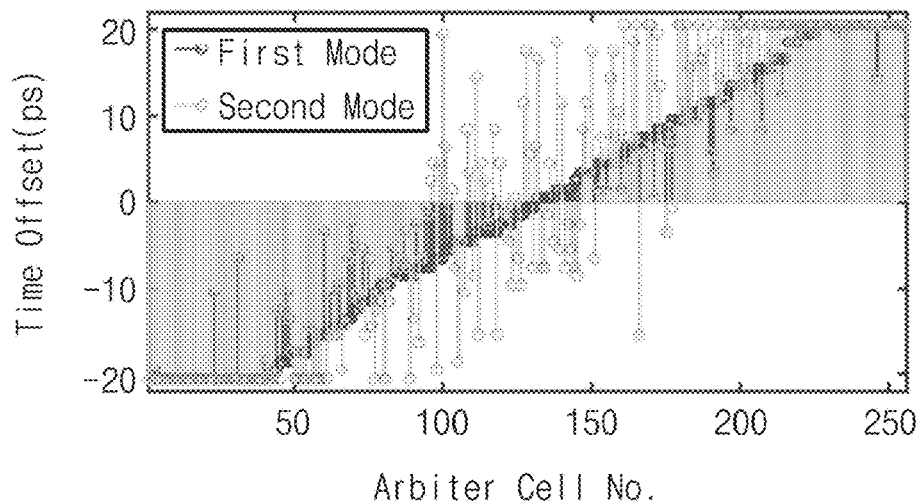
FIG. 5A is a diagram illustrating an example of time offsets of arbiter cells according to an embodiment of the inventive concept.

FIG. 5A is a diagram illustrating an example of time offsets of arbiter cells according to an embodiment of the inventive concept. In detail, two time offsets that each of 255 arbiter cells has is illustrated in FIG. 5A.

Referring to FIG. 5A, each arbiter cell may have two time offsets depending on the 1-bit selection signal SEL. A first mode indicates a mode in which an arbiter cell operates based on the first voltage selected by the selection signal SEL of "0", and a second mode indicates a mode in which an arbiter cell operates based on the second voltage selected by the selection signal SEL of "1". As illustrated in FIG. 5A, the other arbiter cells may have different time offsets with respect to the same selection signal SEL, and each of the arbiter cells may have different time offsets depending on the selection signal SEL. That is, a time offset of each arbiter cell may be selected through the selection signal SEL, and time offsets of arbiter cells may be adjusted by combining selection signals differently. In the case where the number of arbiter cells is 255, the number of possible time offsets may be $2^{255}$.

Figure 5B:
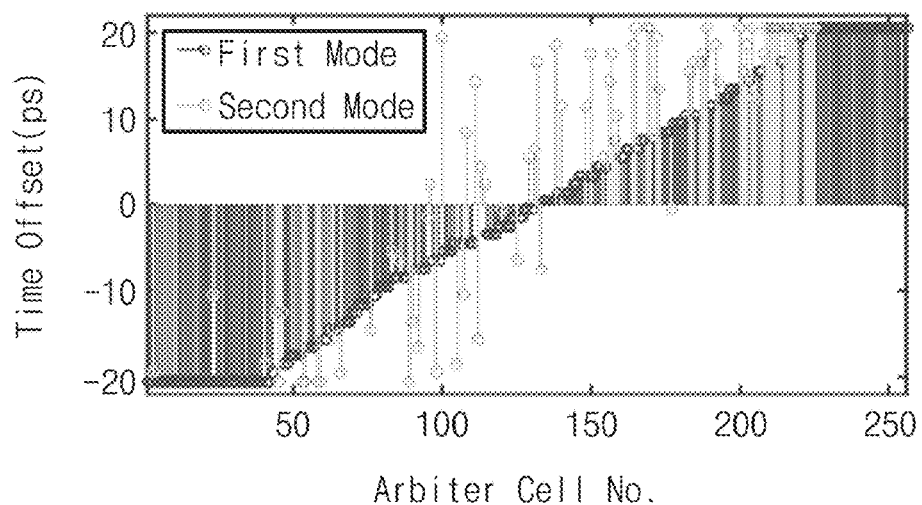
FIG. 5B illustrates time offsets of arbiter cells determined depending on a combination of determined selection signals, according to an embodiment of the inventive concept.

FIG. 5B illustrates time offsets of arbiter cells determined depending on a combination of determined selection signals, according to an embodiment of the inventive concept. In detail, one time offset of each arbiter cell when each of 255 arbiter cells operates in the first mode or the second mode depending on a determined selection signal SEL is illustrated in FIG. 5B. A combination of selection signals corresponding to time offsets of FIG. 5B may be a combination of maximizing the linearity of a stochastic TDC.

Figure 5C:
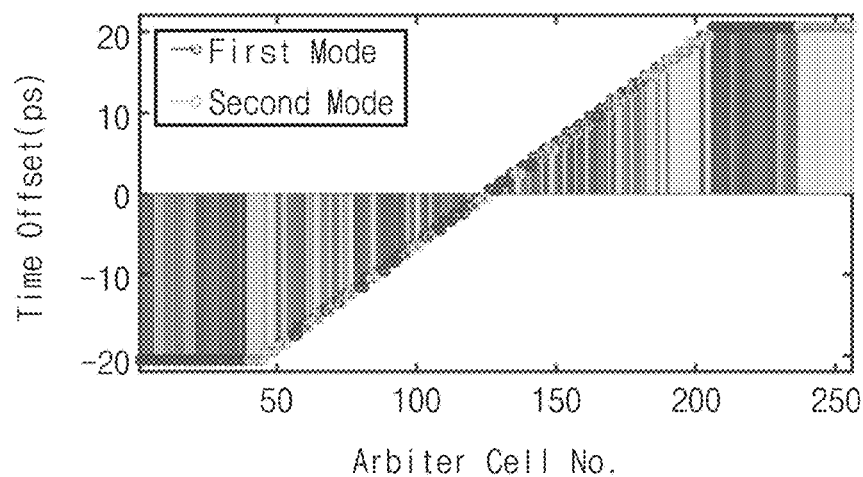
FIG. 5C illustrates time offsets of arbiter cells of FIG. 5B aligned in ascending order from lowest to highest values.

FIG. 5C illustrates time offsets of arbiter cells of FIG. 5B aligned in ascending order from lowest to highest values. As illustrated in FIG. 5C, time offsets of arbiter cells may be linearly distributed depending on selection signals of maximizing the linearity of a stochastic TDC.

Figure 5D:
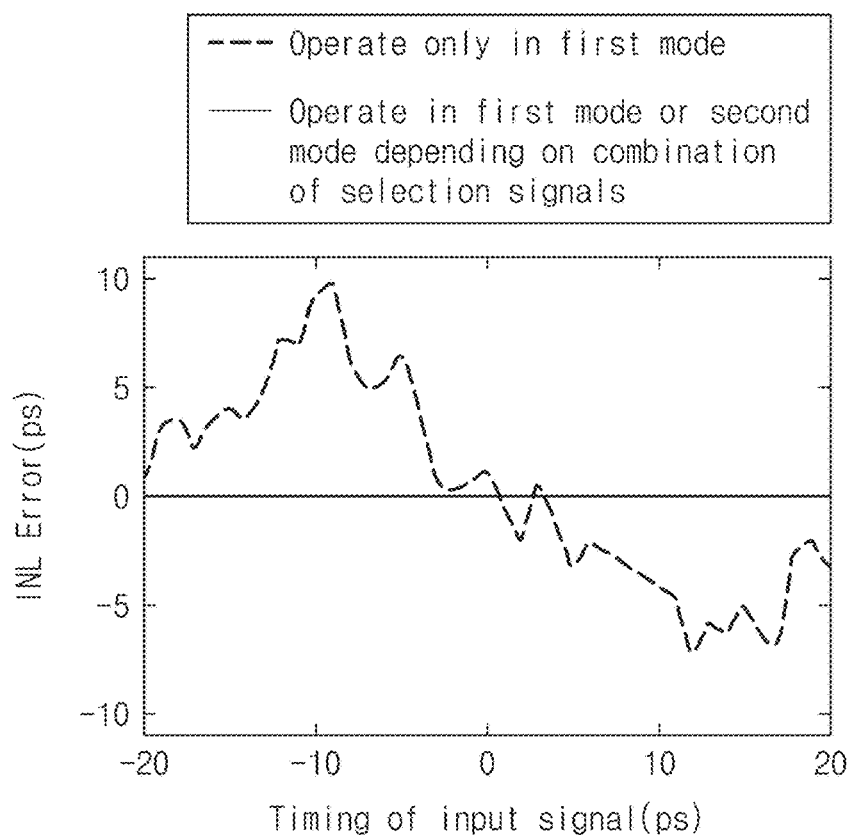
FIG. 5D illustrates an example of an integral non-linearity error of a stochastic TDC according to an embodiment of the inventive concept.

FIG. 5D illustrates an example of an integral non-linearity (INL) error of a stochastic TDC according to an embodiment of the inventive concept. In detail, a dotted line of FIG. 5D indicates an INL error when all arbiter cells operate only in the first mode, and a solid line of FIG. 5D indicates an INL error when arbiter cells operate in the first mode or the second mode depending on a combination of determined selection signals.

As illustrated in FIG. 5D, compared to the case where all arbiter cells operate only in the first mode, INL errors corresponding to various timings of an input signal may decrease in the case where the arbiter cells operate in the first mode or the second mode depending on a combination of selection signals. That is, the INL error may vary depending on a combination of selection signals, and a combination, which minimizes the INL error, from among various combinations of the selection signals may be determined. For example, a combination of selection signals, which minimizes the INL error, may be determined through machine learning. In the case where the INL error is minimized, as illustrated in FIG. 5C, the linearity of a stochastic TDC may be maximized.

Figure 6A:
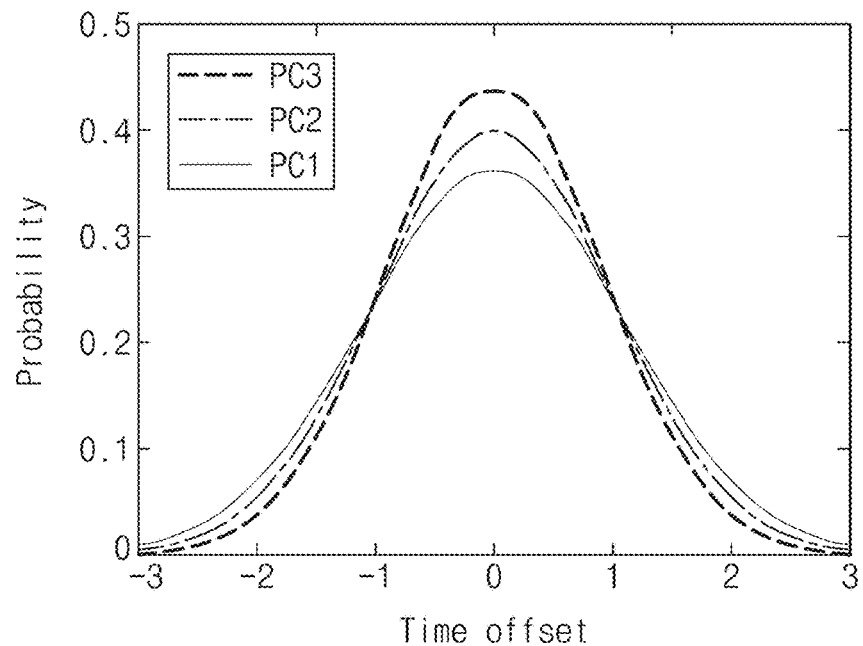
FIG. 6A illustrates a time offset distribution of arbiter cells according to an embodiment of the inventive concept.

FIG. 6A illustrates a time offset distribution of arbiter cells according to an embodiment of the inventive concept. In detail, FIG. 6A illustrates a time offset distribution (e.g., a Gaussian distribution) of arbiter cells depending on a process corner. The process corner indicates an index for a variation of a component characteristic due to a condition change (e.g., a doping concentration) on a semiconductor process.

Characteristics between components may mismatch due to a variation of a component characteristic, and thus, a time offset distribution of arbiter cells may correspond to a Gaussian distribution. In this case, as illustrated in FIG. 6A, a standard deviation of a time offset distribution may vary depending on the process corner. In the case where a speed characteristic of a component is relatively slow, a stochastic TDC may have a characteristic of a first process corner PC1. In the case where a speed characteristic of a component is typical, the stochastic TDC may have a characteristic of a second process corner PC2. In the case where a speed characteristic of a component is relatively fast, the stochastic TDC may have a characteristic of a third process corner PC3. As such, a time offset distribution may vary depending on a process corner characteristic of the stochastic TDC.

A time offset distribution may vary depending on a combination of selection signals. In detail, in the case where arbiter cells operate based on a high voltage (e.g., the first voltage VDDH of FIG. 3) or a low voltage (e.g., the second voltage VDDL of FIG. 3), a time offset distribution may vary depending on a ratio of arbiter cells operating based on the low voltage compared to the high voltage. For example, in the case where the ratio of the arbiter cells operating based on the low voltage increases, a standard deviation of a time offset distribution may be increased. In the case where the ratio of the arbiter cells operating based on the low voltage decreases, a standard deviation of a time offset distribution may be decreased. The ratio of the arbiter cells operating based on the low voltage may be determined depending on a combination of selection signals. That is, as illustrated in FIG. 6A, even though a time offset distribution varies depending on a process corner characteristic, the time offset distribution may be calibrated by adjusting the ratio of the arbiter cells operating based on the low voltage. As such, a change of a time offset distribution due to a process corner characteristic may be calibrated by determining a combination of selection signals.

Figure 6B:
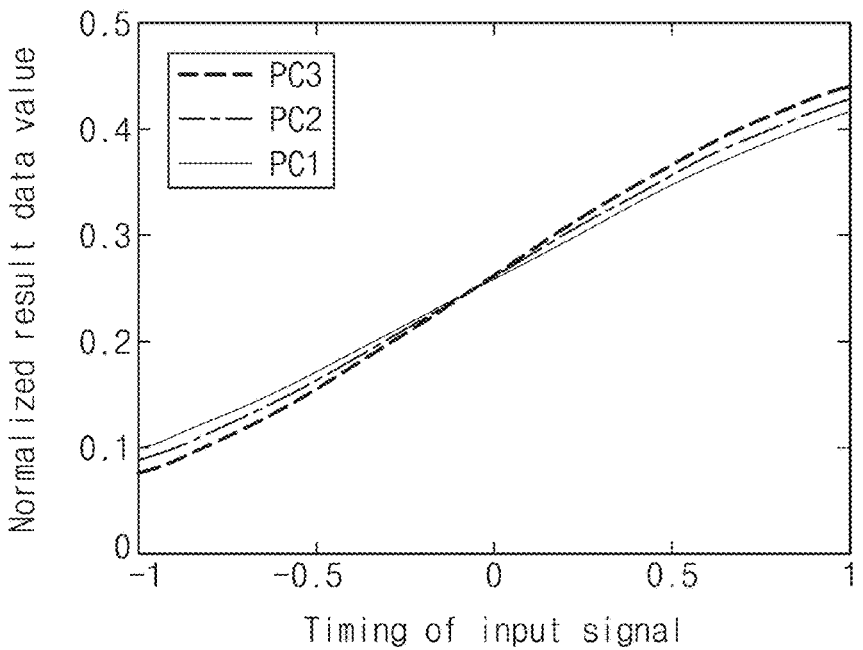
FIG. 6B illustrates result data associated with a timing of an input signal according to an embodiment of the inventive concept.

FIG. 6B illustrates result data associated with a timing of an input signal according to an embodiment of the inventive concept. Here, result data indicate a phase difference between an input signal and a reference signal. As illustrated in FIG. 6B, a result data value associated with a timing of the same input signal may vary depending on a process corner characteristic. For example, with regard to a timing of the same input signal, a result data value of a stochastic TDC having the characteristic of the first process corner PC1 and a result data value of the stochastic TDC having the characteristic of the second process corner PC2 may be different.

A result data value may vary depending on a combination of selection signals. In detail, in the case where arbiter cells operate based on a high voltage (e.g., the first voltage VDDH of FIG. 3) or a low voltage (e.g., the second voltage VDDL of FIG. 3), a result data value may vary depending on a ratio of arbiter cells operating based on the low voltage compared to the high voltage. A standard deviation of a time offset distribution may vary depending on the ratio of the arbiter cells operating based on the low voltage, and thus, a result data value may vary. That is, even though a result data value varies depending on a process corner characteristic, the result data value may be calibrated by adjusting the ratio of the arbiter cells operating based on the low voltage. As such, a change of a result data value due to a process corner characteristic may be calibrated by determining a combination of selection signals.

As described above, in the case of changing a combination of selection signals, a time offset distribution and a result data value of a stochastic TDC according to an embodiment of the inventive concept may be calibrated.

Figure 7:
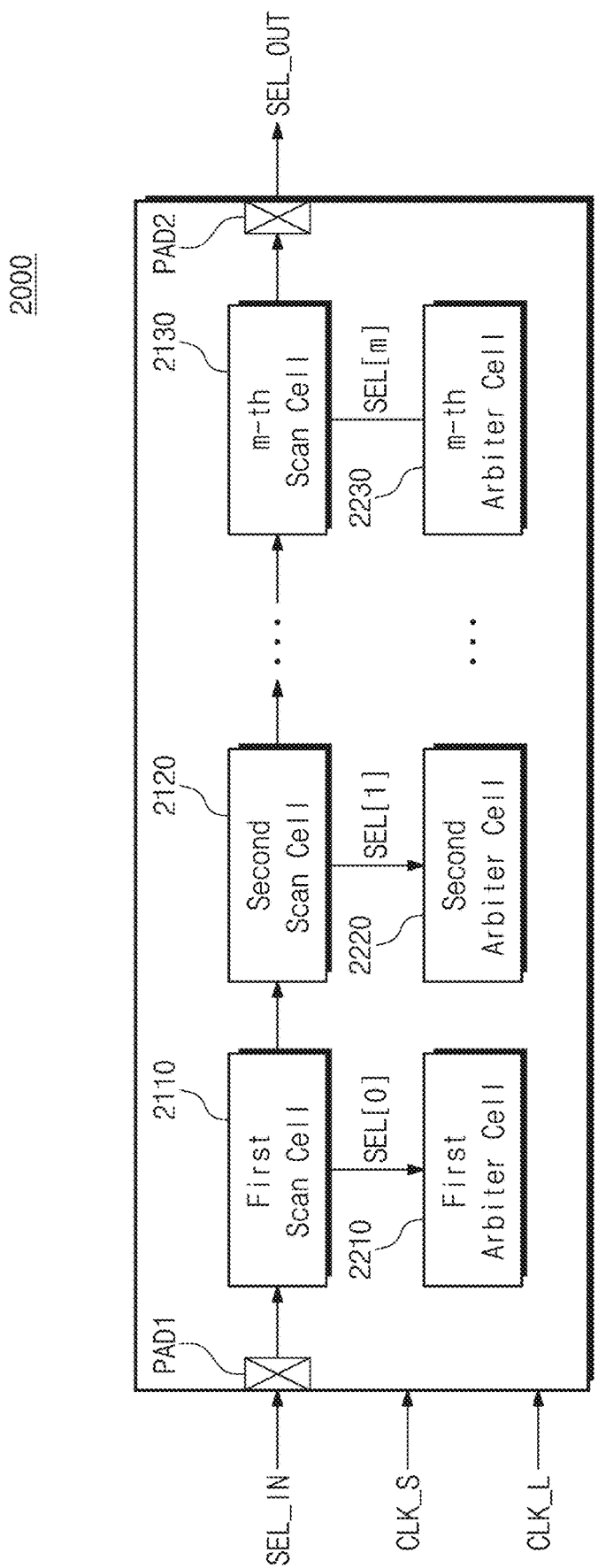
FIG. 7 is an exemplary block diagram of a stochastic TDC for inputting selection signals to arbiter cells according to an embodiment of the inventive concept.

FIG. 7 is an exemplary block diagram of a stochastic TDC for inputting selection signals to arbiter cells according to an embodiment of the inventive concept. Referring to FIG. 7, a stochastic TDC 2000 may include first to m-th scan cells 2110 to 2130 and first to m-th arbiter cells 2210 to 2230.

The stochastic TDC 2000 may receive a selection input signal SEL_IN through a first pad PAD1. The selection input signal SEL_IN may include the selection signals SEL[0] to SEL[m] respectively corresponding to the arbiter cells 2210 to 2230. For example, in the case where each of the selection signals SEL[0] to SEL[m] is a 1-bit signal, the selection input signal SEL_IN may include (m−1) bit signals, which may be serially input through the first pad PAD1. For example, the selection signals SEL[0] to SEL[m] may be sequentially input from the selection signal SEL[m] corresponding to the m-th arbiter cell 2230.

The scan cells 2110 to 2130 may be serially arranged on a path through which the selection input signal SEL_IN is transferred. Each of the scan cells 2110 to 2130 may transfer the selection signal SEL transferred from the first pad PAD1 or another scan cell to a second pad PAD2 or another scan cell in response to a first clock signal CLK_S. For example, the first scan cell 2110 may transfer the selection signal SEL provided through the first pad PAD1 to the second scan cell 2120 in response to the first clock signal CLK_S. The second scan cell 2120 may transfer the selection signal SEL provided from the first scan cell 2110 to a third scan cell (not illustrated) in response to the first clock signal CLK_S. The m-th scan cells 2130 may transfer the selection signal SEL provided from the (m−1)-th scan cell (not illustrated) to the second pad PAD2 in response to the first clock signal CLK_S. As such, the selection input signal SEL_IN including the selection signals SEL[0] to SEL[m] may be output through the second pad PAD2. That is, the scan cells 2110 to 2130 may form one scan-chain circuit.

In the case where the selection signals SEL[0] to SEL[m] input through the first pad PAD1 are transferred to the scan cells 2110 to 2130, the scan cells 2110 to 2130 may respectively sample different selection signals SEL[0] to SEL[m] at the same point of time. For example, at the same point of time, the first scan cell 2110 may sample the selection signal SEL[0], the second scan cell 2120 may sample the selection signal SEL[1], and the m-th scan cell 2130 may sample the selection signal SEL[m].

Each of the scan cells 2110 to 2130 may provide the sampled signal SEL to the corresponding arbiter cell in response to a second clock signal CLK_L. For example, in the case where the selection signals SEL[0] to SEL[m] are respectively sampled at the scan cells 2110 to 2130, the scan cells 2110 to 2130 may provide the selection signals SEL[0] to SEL[m] to the arbiter cells 2210 to 2230, respectively. As such, each of the arbiter cells 2210 to 2230 may receive the corresponding selection signal SEL. For example, the first arbiter cell 2210 may receive the selection signal SEL[0] from the first scan cell 2110. That is, the selection signals SEL[0] to SEL[m] may be provided to the arbiter cells 2210 to 2230 in parallel.

An example is illustrated in FIG. 7 as the selection signals SEL[0] to SEL[m] are input through one pad, but the inventive concept is not limited thereto. For example, the selection signals SEL[0] to SEL[m] may be input to the stochastic TDC 2000 through a plurality of pads.

Figure 8:
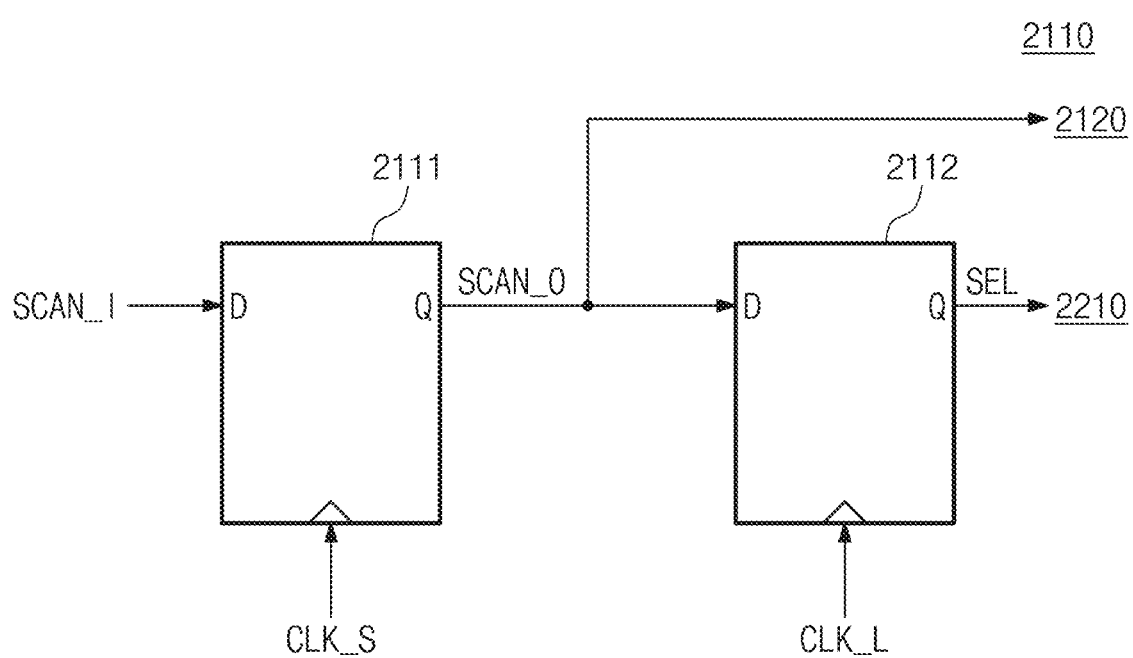
FIG. 8 illustrates an exemplary circuit of a scan cell of FIG. 7.

FIG. 8 illustrates an exemplary circuit of a scan cell of FIG. 7. For convenience of description, a scan cell of FIG. 7 will be described with reference to the first scan cell 2110. Referring to FIG. 8, the first scan cell 2110 may include a first flip-flop 2111 and a second flip-flop 2112. The first flip-flop 2111 may receive a scan input SCAN_I and may output a scan output SCAN_O in response to the first clock signal CLK_S. The scan output SCAN_O may be the same signal as the scan input SCAN_I. The scan output SCAN_O output from the first flip-flop 2111 may be transferred to the second scan cell 2120 and the second flip-flop 2112.

The second flip-flop 2112 may receive the scan output SCAN_O and may output the selection signal SEL in response to the second clock signal CLK_L. The output selection signal SEL may be transferred to the first arbiter cell 2210. The selection signal SEL may be the same signal as the scan output SCAN_O. For example, in the case where the scan output SCAN_O transferred to the second flip-flop 2112 is the selection signal SEL[0], the second flip-flop 2112 may transfer the selection signal SEL[0] to the first arbiter cell 2210 in response to the second clock signal CLK_L.

As described with reference to FIGS. 7 and 8, in the case where the selection signals SEL[0] and SEL[m] are input by using an on-chip serial-to-parallel interface, the selection signals SEL[0] to SEL[m] may be input by using the small number of pads (or pins). A time offset coming from a mismatch between elements due to a process variable may vary depending on a process, a supplied power, and a temperature, but a change of the process, the supplied power, and the temperature is very slow compared to an operating speed of a chip. Accordingly, even though the selection signals SEL[0] to SEL[m] are input by using the scan-chain circuit of FIGS. 7 and 8, it may have no influence on an operation of a stochastic TDC of the inventive concept.

As described above, according to a stochastic TDC of the inventive concept, 1-bit tenability may be provided through 1-bit calibration easy to operate. The 1-bit tenability may fail to finely tune a time offset of each arbiter cell but may make it possible to implement almost perfect linearity by maximizing the number of combinations of time offsets of a plurality of arbiter cells. As such, according to the stochastic TDC of the inventive concept, ultrafine resolution may be provided, the efficiency of a circuit may be improved, and power consumption of a circuit may be reduced.

According to an embodiment of the inventive concept, the linearity of a stochastic TDC may be improved by maximizing the number of combinations of time offsets of a plurality of arbiter cells.

Also, according to an embodiment of the inventive concept, the stochastic TDC that has ultrafine resolution and improved efficiency of a circuit and reduces power consumption may be provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A stochastic time-to-digital converter comprising:
a first arbiter cell configured to compare a timing of a reference signal with a timing of an input signal based on a voltage selected by a first selection signal from among a first voltage or a second voltage and to output a first comparison result;
a second arbiter cell configured to compare the timing of the reference signal with the timing of the input signal based on a voltage selected by a second selection signal from among the first voltage or the second voltage and to output a second comparison result; and
a binary converter configured to calculate a phase difference between the reference signal and the input signal based on the first comparison result and the second comparison result.

2. The stochastic time-to-digital converter of claim 1, wherein each of the first selection signal and the second selection signal is a 1-bit signal.

3. The stochastic time-to-digital converter of claim 1, wherein, when the first arbiter cell operates based on the first voltage, the first arbiter cell has a first time offset, and
wherein, when the first arbiter cell operates based on the second voltage, the first arbiter cell has a second time offset different from the first time offset.

4. The stochastic time-to-digital converter of claim 3, wherein, when the second arbiter cell operates based on the first voltage, the second arbiter cell has a third time offset different from the first time offset, and
wherein, when the second arbiter cell operates based on the second voltage, the second arbiter cell has a fourth time offset different from the second time offset.

5. The stochastic time-to-digital converter of claim 1, wherein the first selection signal and the second selection signal are determined so that an integral non-linearity (INL) error of the stochastic time-to-digital converter is minimized.

6. The stochastic time-to-digital converter of claim 1, wherein the first selection signal and the second selection signal are determined based on a process corner characteristic of the stochastic time-to-digital converter.

7. The stochastic time-to-digital converter of claim 1, further comprising:
a scan-chain circuit configured to receive the first selection signal and the second selection signal in series through one pad in response to a first clock signal and to respectively provide the first selection signal and the second selection signal to the first arbiter cell and the second arbiter cell in parallel in response to a second clock signal.

8. An operating method of a stochastic time-to-digital converter which includes a plurality of arbiter cells, the method comprising:
receiving selection signals corresponding to at least two arbiter cells of the plurality of arbiter cells;
generating a timing comparison result of comparing a timing of a reference signal with a timing of an input signal, based on a voltage selected by a corresponding selection signal of the selection signals from among a first voltage or a second voltage, through each of the at least two arbiter cells; and
calculating a phase difference between the reference signal and the input signal based on timing comparison results of the reference signal and the input signal generated from the at least two arbiter cells.

9. The method of claim 8, wherein each of the selection signals is a 1-bit signal.

10. The method of claim 8, wherein each of the at least two arbiter cells has different time offsets with respect to the first voltage and the second voltage.

11. The method of claim 8, wherein the selection signals are determined so that an integral non-linearity (INL) error of the stochastic time-to-digital converter is minimized.

12. The method of claim 8, wherein the selection signals are determined based on a process corner characteristic of the stochastic time-to-digital converter.

13. The method of claim 8, wherein a time offset which each of the at least two arbiter cells has with respect to the selected voltage is within an input range of the stochastic time-to-digital converter.

14. The method of claim 8, wherein, when a number of the at least two arbiter cells is "m", a number of combinations of time offsets which the at least two arbiter cells have is $2^m$.

* * * * *